US010633738B2

United States Patent
Nguyen et al.

(10) Patent No.: US 10,633,738 B2
(45) Date of Patent: Apr. 28, 2020

(54) CHAMBER COMPONENT WITH PROTECTIVE COATING SUITABLE FOR PROTECTION AGAINST FLUORINE PLASMA

(71) Applicant: Applied Materials, Inc., Santa Clara, CA (US)

(72) Inventors: Son T. Nguyen, San Jose, CA (US); Michael Fong, Mill Valley, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 187 days.

(21) Appl. No.: 15/473,320

(22) Filed: Mar. 29, 2017

(65) Prior Publication Data

US 2017/0204516 A1    Jul. 20, 2017

Related U.S. Application Data

(63) Continuation of application No. 14/176,550, filed on Feb. 10, 2014, now abandoned.

(60) Provisional application No. 61/775,044, filed on Mar. 8, 2013.

(51) Int. Cl.
| | |
|---|---|
| *C23C 16/40* | (2006.01) |
| *C23C 16/34* | (2006.01) |
| *C23C 16/44* | (2006.01) |
| *C23C 16/50* | (2006.01) |

(52) U.S. Cl.
CPC .............. *C23C 16/34* (2013.01); *C23C 16/40* (2013.01); *C23C 16/4404* (2013.01); *C23C 16/4405* (2013.01); *C23C 16/50* (2013.01)

(58) Field of Classification Search
CPC ... C23C 16/403; C23C 16/56; C23C 16/4404; C23C 16/4405; C23C 16/30; C23C 16/045

USPC ....................................... 118/715; 156/345.1
See application file for complete search history.

(56) References Cited

U.S. PATENT DOCUMENTS

| | | | |
|---|---|---|---|
| 6,139,983 A | 10/2000 | Ohashi et al. | |
| 6,379,492 B2 | 4/2002 | Bang et al. | |
| 6,447,937 B1 * | 9/2002 | Murakawa | C04B 35/18 428/446 |
| 6,829,279 B1 | 12/2004 | Ohmi et al. | |
| 6,868,856 B2 | 3/2005 | Nowak et al. | |
| 6,875,477 B2 | 4/2005 | Trickett et al. | |
| 8,012,315 B2 | 9/2011 | Ino et al. | |
| 2004/0108308 A1 * | 6/2004 | Okajima | H01L 21/67103 219/468.1 |
| 2005/0112289 A1 | 5/2005 | Trickett et al. | |
| 2006/0164013 A1 | 7/2006 | Park | |
| 2009/0002913 A1 | 1/2009 | Naim | |
| 2011/0297319 A1 | 12/2011 | Chen et al. | |

FOREIGN PATENT DOCUMENTS

| | | |
|---|---|---|
| CN | 101335227 A | 12/2008 |
| CN | 102272344 A | 12/2011 |

(Continued)

OTHER PUBLICATIONS

Chinese Office Action dated Aug. 14, 2018 for Application No. 201480013077.

(Continued)

*Primary Examiner* — Rudy Zervigon
(74) *Attorney, Agent, or Firm* — Patterson + Sheridan LLP

(57) ABSTRACT

Embodiments described herein relate to a protective coating that protects an underlying chamber component (i.e. the object upon which the coating is being deposited) from corrosion or deterioration within a corrosive environment.

12 Claims, 3 Drawing Sheets

(56) References Cited

FOREIGN PATENT DOCUMENTS

| JP | H104083 A | 1/1998 |
|---|---|---|
| JP | 2001509639 A | 7/2001 |
| JP | 2004-241203 A | 8/2004 |
| JP | 2012-532987 A | 12/2012 |
| JP | 2016520707 A | 7/2016 |
| KR | 10-2008-0023992 | 3/2008 |
| WO | 2000026434 A1 | 5/2000 |

OTHER PUBLICATIONS

Holcombe et al, Materials for High-Temperature Hydrogen-Fluorine Environments, Union Carbide, Oak Ridge Y-12 Plant, TN Report No. Y/DA-7745, Feb. 21, 1978, 55 pages.

International Search Report and Written Opinion for International Application No. PCT/US2014/015153 dated May 28, 2014.
Search Report in related application CN 2014800130770 dated Mar. 17, 2017.
Search Report for Chinese Application No. 2014800130770 dated Mar. 6, 2018.
Office Action for Chinese Application No. 201480013077.0 dated Feb. 3, 2019.
Reconsideration Report by Examiner before Appeal for Japanese Patent Application No. 2015-561354 dated Apr. 12, 2019.
Chinese Office Action dated Jan. 8, 2020 for Application No. 201480013077.0.
Japanese Office Action dated Jan. 6, 2020, for Japanese Patent Application No. 2015-561354.
CN Office Action dated Sep. 10, 2019 for Application No. 201480013077.0.
Japanese Office Action dated Feb. 17, 2020, for Japanese Patent Application No. 2018-238045.

* cited by examiner

CHAMBER COMPONENT WITH PROTECTIVE COATING SUITABLE FOR PROTECTION AGAINST FLUORINE PLASMA

CROSS-REFERENCE TO RELATED APPLICATIONS

This application is a continuation of U.S. Non-Provisional patent application Ser. No. 14/176,550 filed Feb. 10, 2014, which claims benefit of U.S. Provisional Patent Application Ser. No. 61/775,044, filed Mar. 8, 2013, which are herein incorporated by reference.

BACKGROUND

Field

Embodiments described herein relate to a protective coating that protects an underlying chamber component (i.e. the object upon which the coating is being deposited) or component part from corrosion or deterioration within a corrosive environment.

Description of the Related Art

In semi-conductor chamber component processing systems, the interior of a processing chamber is often exposed to a variety of corrosive or reactive environments. These reactive environments may result from either stable corrosive gases, such as $Cl_2$, or other reactive species, including radicals or by-products generated from process reactions. In plasma processing applications, such as etching or chemical vapor deposition (CVD), reactive species are also generated through dissociation of other molecules, which by themselves, may or may not be corrosive or reactive. Protective and corrosion resistant measures are needed to ensure process performance and durability of the process chamber or components within the chamber.

Reducing corrosion of the chamber or components within the chamber also reduces the presence of undesirable particles within the chamber. For example, nickel-plated components are often used in process chambers to prevent corrosion from $Cl_2$. Fluorine containing gases such as $NF_3$ or $CHF_3$, among others, give rise to atomic fluorine (F), which is highly reactive. High temperature CVD processes often use AlN heaters which are susceptible to attack from elements, such as fluorine based cleaning gases. For example, ceramic heaters made of AlN are attacked by $NF_3$, which is often used as a cleaning gas in certain chamber component processing systems. The AlN heaters are generally expensive and it is desirable to increase the service life of the heater surfaces and reduce the presence of undesirable particles in the chamber.

Accordingly, there is a need in the art for semiconductor processing components, such as ceramic heaters, having improved resistance to elements, such as fluorine.

SUMMARY

Embodiments described herein generally relate to protective coatings for semiconductor chamber components. More specifically, embodiments described herein relate to a protective coating of an aluminum nitride (AlN) heater suitable for increased resistance against fluorine plasma.

In one embodiment, a chamber component for use in a semiconductor processing chamber is provided. The chamber component has a surface comprised of aluminum nitride. The surface has a coating and the coating comprises either magnesium fluoride or lanthanum fluoride.

In another embodiment, a method of forming a coating on a chamber component for use in a semiconductor processing chamber is provided. The method includes depositing a coating on a surface of a chamber component. The coating comprises at least one of magnesium oxide, lanthanum oxide, or lanthanum fluoride. The coating may optionally be exposed to a fluorine containing plasma.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to a protective coating that protects an underlying chamber component (i.e. the object upon which the coating is being deposited) or component part from corrosion or deterioration within a corrosive environment.

Figure 1A:
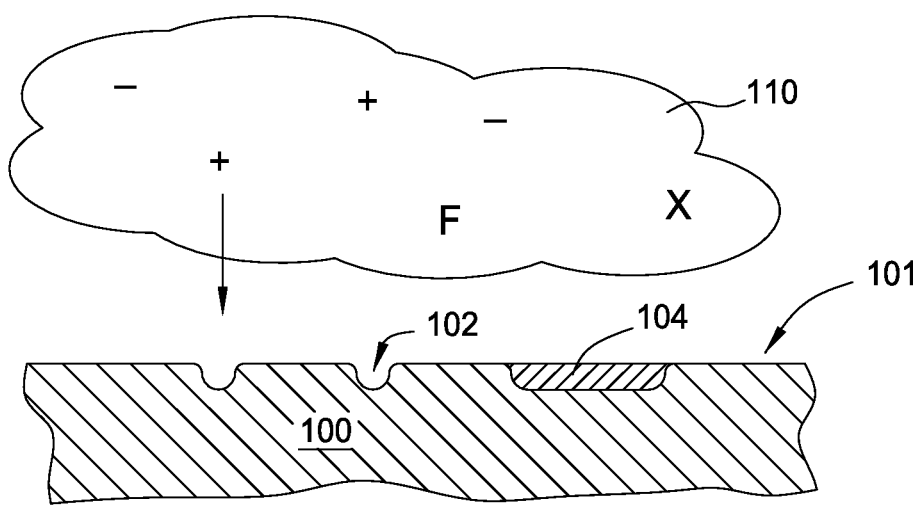
FIG. 1A depicts a partial cross sectional view of a conventional processing chamber exposed to a generally corrosive or reactive environment.
Figure 1B:
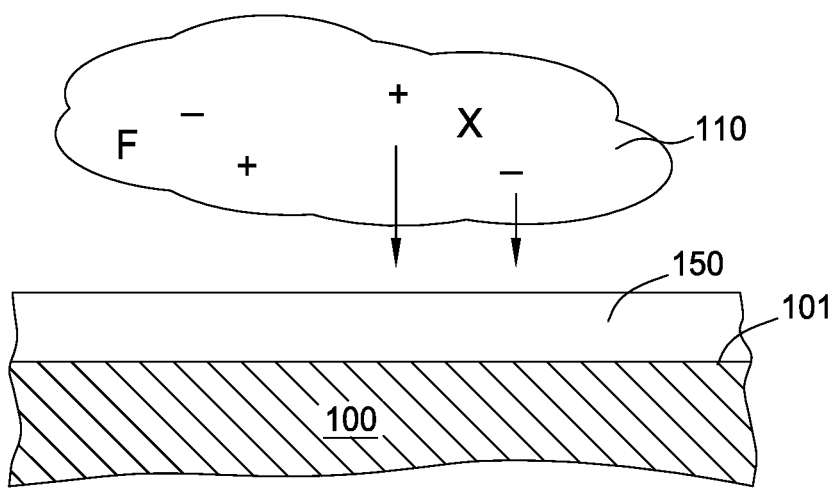
FIG. 1B illustrates a partial cross sectional view of a processing chamber component being exposed to the corrosive environment having a protective coating.

FIGS. 1A-B schematically illustrate the protective effects of a coating upon a chamber component. FIG. 1A depicts a partial cross sectional view of a conventional processing chamber component 100 exposed to a generally corrosive or reactive environment 110. For example, the chamber component 100 may be subjected to attack by species in the surrounding environment 110, which may result in pits 102 or other defects 104 formed on the surface 101 of the chamber component 100. Depending on the reactive environment 110, deterioration of the chamber component 100 may be caused by chemical or physical attacks, and may not necessarily result in readily visible defects such as those illustrated in FIG. 1A. For example, chemical or physical characteristics of the chamber component 100 may be altered by chemical reactions between species such as Fluorine (F), or other reactive species (generally denoted as "X"), in the environment 110 and the chamber component 100, or by physical bombardment of energetic species (i.e., + and − ions).

FIG. 1B illustrates a cross sectional view of a chamber component 190 being exposed to the corrosive environment 110 after a coating 150 has been formed upon the chamber component 190. The coating 150 of the present invention is resistant to attack by the reactive or corrosive environment 110, and deterioration of the underlying chamber component 190 can be reduced or avoided. The chamber component 190 may be a pedestal, susceptor, lift pin, liner, heater, electrostatic chuck, shield, edge ring, showerhead, dome, chamber body, or other chamber component.

In one embodiment, the coating 150 comprises either magnesium oxide (MgO) or lanthanum oxide ($La_2O_3$). In another embodiment, the coating comprises lanthanum fluoride ($LaF_3$). The coating 150 may be used to coat interior surfaces of the chamber component 190 which may be exposed to a plasma environment. For example, the coating 150 may be applied to aluminum (Al) or aluminum nitride (AlN) chamber components, such as ceramic heaters employed within CVD chambers. Al and AlN typically corrode and deteriorate with time when they are repeatedly exposed to high temperature CVD process environments. The coating 150 prevents corrosion of the heater surface when exposed to a corrosive environment 110. An example of a corrosive environment 110 may be the presence of a plasma containing fluoride at temperatures above 400° C.

The coating 150 of either MgO, $La_2O_3$, or $LaF_3$ may be formed on the chamber component by different processes. The coating processes generally include for example, high temperature evaporation and sputtering, such as physical vapor deposition (PVD), CVD, plasma enhanced CVD (PECVD), hybrid CVD, atomic layer deposition (ALD), electron beam vaporization, or other processes suitable for depositing a coating on a chamber component. However, the specific coating process is not critical to the practice of the embodiments described herein, so long as the process results in a high quality coating with desirable corrosion preventing characteristics.

In one embodiment, the coating process may be performed by a CVD process to coat a chamber or chamber component part. The CVD deposition may be advantageously performed if the chamber or chamber component part exhibits a non-planar topography as a result of the conformality of a CVD deposition process. The CVD deposition is also appropriate for deposition on substantially planar surfaces. In an embodiment using a CVD coating process, the coating 150 comprising MgO may be formed on the chamber component 190 by providing a magnesium containing precursor and an oxygen containing precursor. In an embodiment using a CVD coating process, a coating 150 comprising $La_2O_3$ may be formed on the chamber component 190 by providing a lanthanum containing precursor and an oxygen containing precursor.

In an embodiment using a CVD coating process, a coating 150 comprising $LaF_3$ may be formed on the chamber component 190 by providing a lanthanum containing precursor and a fluorine containing precursor. In all of the above embodiments, the precursors may be any precursors that are suitable for providing the desired coating. Additionally, carrier gases, such as inert gases, may be provided along with the deposition precursor gases.

Figure 2:
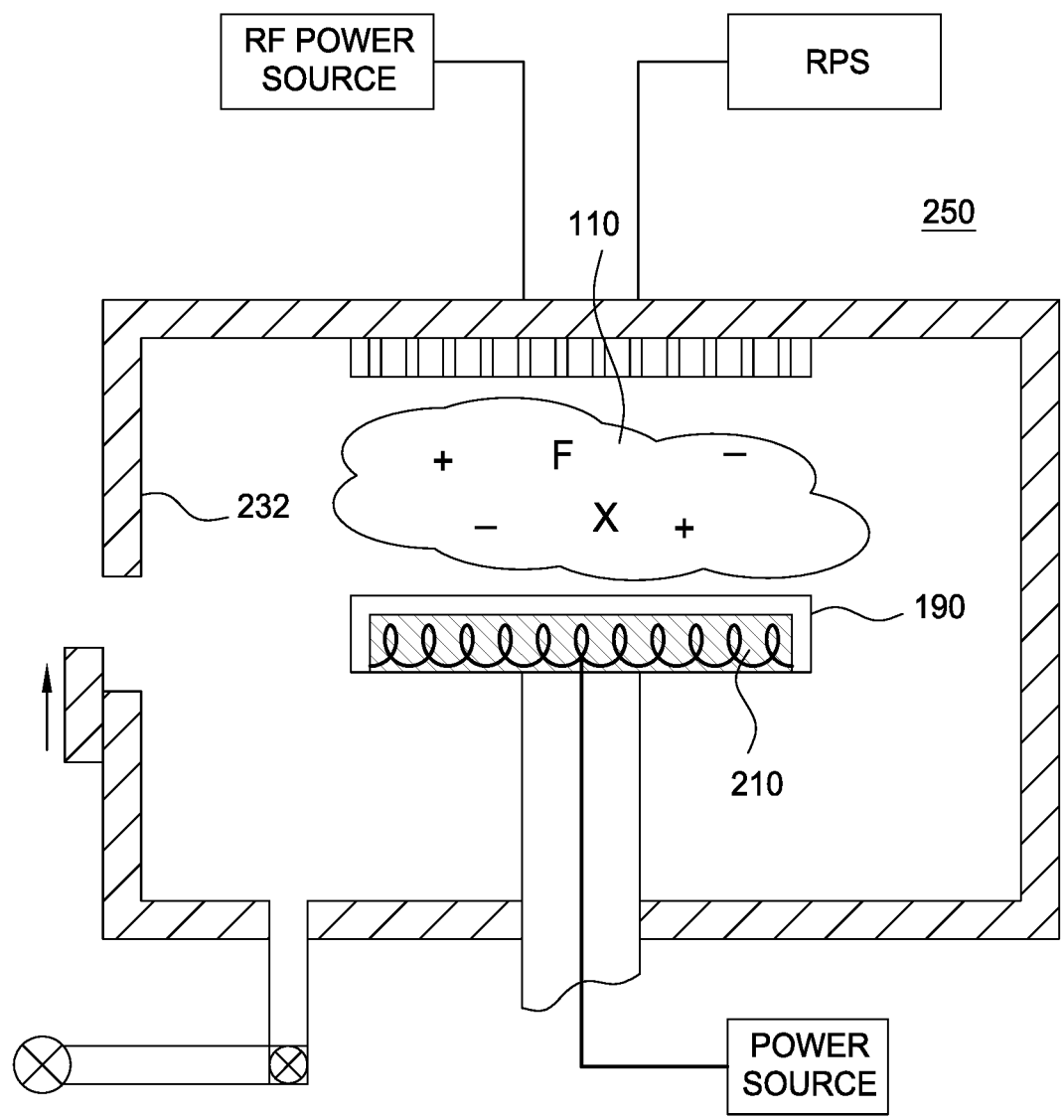
FIG. 2 illustrates certain embodiments of the invention having a processing chamber component with a protective coating disposed in a plasma processing chamber.

FIG. 2 illustrates certain embodiments of the invention where the coating 150 is formed on the chamber component 190. In the embodiment shown, the protective coating 150 is disposed on a chamber component 190 in the form of a substrate support 210. More specifically, the substrate support 210 may comprise a ceramic body made of AlN and having an embedded heater. The substrate support 210 may be used in a plasma processing chamber 250, such as a CVD chamber, for heating the chamber component to a high processing temperature. Any exposed surface of the substrate support 210 is susceptible to attack upon exposure to a corrosive environment 110, such as components in the process gases, or a plasma containing a chamber cleaning gas such as $NF_3$.

In a CVD chamber configured for oxide (i.e., $SiO_2$) deposition, oxide is deposited both on the surface of a chamber component, as well as upon the interior surfaces 252 of the chamber 250 and other chamber components, such as the substrate support 210, inside the chamber 250. To maintain efficient process and chamber operation, the oxide deposits must be removed from the interior chamber surfaces 252 and chamber components. The oxide removal is typically achieved via a cleaning step that employs a fluorine-containing gas, such as $NF_3$, to etch away the oxide deposits.

In certain embodiments, fluorine is provided to the chamber 250 via a remote plasma source (RPS). The RPS forms a plasma from a precursor gas which causes dissociation of the precursor gas to form cleaning radicals. In one embodiment, the cleaning radicals are F atoms or F+ ions derived from a precursor gas such as $NF_3$ or $C_xF_y$. Alternatively, the precursor gas can be any liquid, gas, or solid, which can be reacted to form cleaning radicals. The RPS cleaning may be performed under conditions generally known in the art to clean a CVD processing chamber 250. Such cleaning processes generally use fluorine plasma at a temperature greater than about 400° C.

As the fluorine plasma cleans the chamber 250, the fluorine atoms or radicals react with other compounds present in the chamber 250. In one embodiment, the fluorine plasma reacts with the MgO or $La_2O_3$ which has been coated on the surface of the substrate support 210. As a result of their chemical nature, the fluorine atoms bond with the magnesium or lanthanum and displace the oxygen originally present in the coating 150. Thus, the coating 150 on the substrate support 210 transforms to either magnesium fluoride ($MgF_2$) or lanthanum fluoride ($LaF_3$). In an embodiment where the substrate support 210 was originally coated with $LaF_3$, the $LaF_3$ acts as a protective coating and is generally inert and unreactive in the fluorine plasma, thus protecting the AlN heater from the corrosive cleaning environment 110.

Figure 3:
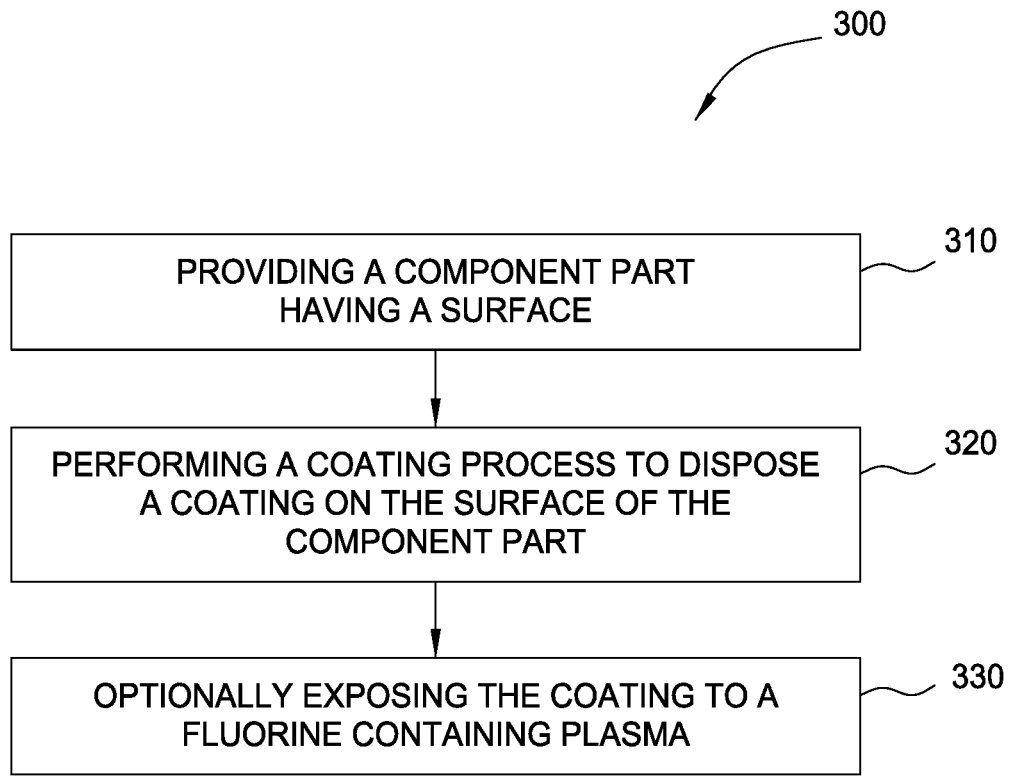
FIG. 3 depicts method steps for forming a protective coating on a chamber component.

FIG. 3 depicts method steps for forming a protective coating on a chamber component. The method 300, begins at step 310 by providing a chamber component. In one embodiment, the chamber component is a ceramic heater comprising AlN. At step 320, a coating process is performed to dispose a coating on the surface of the chamber component. The coating, as discussed above, may be any of MgO, $La_2O_3$, or $LaF_3$, or any combination thereof. In one embodiment, a deposition process, such as a CVD process, may be used to coat the AlN heater.

The coating is then optionally exposed to a fluorine containing plasma at step 330. The fluorine containing plasma reacts with the previously deposited MgO or $La_2O_3$ coating to form a magnesium fluoride or lanthanum fluoride coating. The fluorine-containing plasma may be part of a chamber cleaning process which is performed at a temperature of greater than about 400° C. In an exemplary embodiment, a magnesium fluoride or lanthanum fluoride corrosion resistant protective coating is disposed on the surface of the AlN heater.

The magnesium fluoride and lanthanum fluoride coatings are resistant to attack (either chemically or physically) by reactive species within a CVD chamber processing environment. Thus, the magnesium fluoride or lanthanum fluoride provide improved protection substantially reduces deterioration and corrosion of an AlN heater in the presence of a fluorine containing plasma. Moreover, the protective coating is effective in processing environments above 400° C.

The specific embodiments disclosed for use with CVD chambers under high temperature conditions are meant to be illustrative only. The embodiments described herein are generally applicable to other corrosive environments, such as those commonly encountered in etching, plasma, or reactive processes.

While the foregoing is directed to embodiments of the present invention, other and further embodiments of the invention may be devised without departing from the basic scope thereof, and the scope thereof is determined by the claims that follow.

The invention claimed is:

1. A plasma processing chamber component, comprising:
the plasma processing chamber component selected from the group consisting of a pedestal, a susceptor, a substrate support, a lift pin, a liner, a heater, an electrostatic chuck, a shield, an edge ring, and a showerhead, wherein a surface of the plasma processing chamber component comprises aluminum nitride; and
a lanthanum based coating disposed on the surface of the plasma processing chamber component, wherein the lanthanum based coating is selected from the group consisting essentially of lanthanum oxide, lanthanum fluoride, and a combination thereof, wherein the lanthanum based coating is formed by exposing the surface of the plasma processing chamber component to a lanthanum precursor and an oxygen precursor to deposit a lanthanum oxide layer, and for the lanthanum fluoride and the combination of lanthanum oxide and lanthanum fluoride further exposing the lanthanum oxide layer to a fluorine based plasma.

2. The plasma processing chamber component of claim 1, wherein the plasma processing chamber component is a substrate support.

3. The plasma processing chamber component of claim 2, wherein a heater is disposed in the substrate support.

4. The plasma processing chamber component of claim 3, wherein the coating is lanthanum oxide.

5. The plasma processing chamber component of claim 3, wherein the coating is lanthanum fluoride.

6. A substrate support, comprising:
an aluminum nitride body having an embedded heater disposed therein; and
a coating selected from the group consisting essentially of lanthanum oxide, lanthanum fluoride, and a combination thereof disposed on a surface of the aluminum nitride body, wherein the coating is formed by exposing the surface to a lanthanum precursor and an oxygen precursor to deposit a lanthanum oxide layer, and for the lanthanum fluoride and the combination of lanthanum oxide and lanthanum fluoride further exposing the lanthanum oxide layer to a fluorine based plasma.

7. The substrate support of claim 6, wherein the coating is lanthanum oxide.

8. The substrate support of claim 6, wherein the coating is lanthanum fluoride.

9. An article, comprising:
a substrate support having an aluminum nitride surface; and
a coating disposed on the aluminum nitride surface, the coating selected from the group consisting essentially of lanthanum oxide, lanthanum fluoride, and a combination thereof, wherein the coating is formed by exposing the aluminum nitride surface to a lanthanum precursor and an oxygen precursor to deposit a lanthanum oxide coating, and for the lanthanum fluoride and the combination of lanthanum oxide and lanthanum fluoride further exposing the lanthanum oxide coating to a fluorine based plasma.

10. The article of claim 9, wherein the substrate support further comprises a heater.

11. The article of claim 10, wherein the coating consists essentially of lanthanum oxide.

12. The article of claim 10, wherein the coating consists essentially of lanthanum fluoride.

* * * * *